United States Patent [19]
Collins et al.

[11] Patent Number: 6,018,125
[45] Date of Patent: Jan. 25, 2000

[54] HIGH FREQUENCY EMI SHIELD WITH AIR FLOW FOR ELECTRONIC DEVICE ENCLOSURE

[76] Inventors: Pat Eliot Collins, 3470 Parkmoor Village Dr. Apt. G; Theodore Ernst Bruning, III, 14550 Timberedge Ln.; Grant Edward Carlson, 189A Paradise Circle, all of Colorado Springs, Colo. 80919

[21] Appl. No.: 08/751,127

[22] Filed: Nov. 15, 1996

[51] Int. Cl.⁷ .................................................. H02K 9/00
[52] U.S. Cl. ........................................................ 174/35 R
[58] Field of Search ........................... 174/35 R, 17 VA, 174/35 TS; 361/753, 799, 816, 818

[56] References Cited

U.S. PATENT DOCUMENTS

| | | | |
|---|---|---|---|
| 4,663,240 | 5/1987 | Hajdu et al. | 428/545 |
| 4,879,434 | 11/1989 | Assel et al. | 174/35 R |
| 5,431,974 | 7/1995 | Pierce | 428/45 |
| 5,576,513 | 11/1996 | Gunther et al. | 174/35 R |

*Primary Examiner*—Nestor Ramirez
*Assistant Examiner*—Joseph Waks
*Attorney, Agent, or Firm*—Holland & Hart LLP

[57] ABSTRACT

An EMI shielded enclosure has a plurality of electrically conductive walls. The conductive walls are electrically connected so electromagnetic radiation from within the enclosure cannot radiate through the walls. An EMI shield plate, that makes up at least one wall of the enclosure, is an electrically non-conductive, plastic wall with tunnel holes through the wall. The holes provide for air flow into and out of the enclosure. A conductive coating on the non conductive wall and the holes converts the non-conductive plastic wall into a conductive wall with waveguide attenuating. The waveguide attenuating holes, when so coated with the conductive layer, attenuate electromagnetic radiation passing from inside the enclosure through said holes to outside the enclosure. The waveguide attenuating holes effectively attenuate electromagnetic radiation at frequencies up to 5 gigahertz.

4 Claims, 3 Drawing Sheets

HIGH FREQUENCY EMI SHIELD WITH AIR FLOW FOR ELECTRONIC DEVICE ENCLOSURE

CROSS REFERENCE TO RELATED APPLICATIONS

Copending, commonly assigned patent applications: Ser. No. 08/751,126 entitled ATTENUATING VIBRATIONS IN A MOUNTING SHELF FOR MULTIPLE DISK DRIVES; Ser. No. 08/749,466 entitled ANTI-SLAMMING LATCH APPARATUS FOR MODULAR COMPONENT INSTALLATIONS; and Ser. No. 08/749,465 entitled TAB AND SLOT DISK DRIVE VIBRATION REDUCTION STRUCTURE all filed concurrently herewith, and incorporated herein by reference.

BACKGROUND OF THE INVENTION

1. Field of the Invention

This invention relates to an EMI shield for an enclosure for an electronic device. More particularly, the invention relates to an EMI shield designed to permit air flow through the EMI shield to cool the electronic device and designed to attenuate the passage of very high frequency electromagnetic radiation generated by the electronic device inside the enclosure.

2. Description of the Related Art

In computing systems, computer peripheral electronic devices, such as disk drives and tape drives, are mounted in shelf frames containing a plurality of the devices. Each peripheral device is mounted in an enclosure, and the enclosure is then mounted in the shelf frame. A plurality of frames may be mounted in a cabinet. It is very important to provide an EMI shielding enclosure around each of the peripheral devices so that electromagnetic radiation generated by the devices is substantially contained within the enclosure. Ideally, the enclosure for each peripheral device is designed as a Faraday cage.

The EMI shielding enclosure around each device would be most easily accomplished by providing a six-sided metal box with no holes. However, this is not practical, as the peripheral device inside the box must make electrical contact with circuitry outside the box. Further, the peripheral device will generate heat, and therefore each device must be cooled by air flow through the box.

A very successful solution to the problem of providing EMI shielding, while providing electrical connections and air flow for cooling, is shown in U.S. Pat. No. 5,483,423, entitled "EMI Shielding for Components" and issued to Mark S. Lewis et al on Jan. 9, 1996. As shown in the Lewis et al patent, the conductive enclosure for the peripheral device has an open back end that permits the peripheral device to plug into a back plane at the back of a shelf frame or cabinet. The other five walls of the enclosure are conductive walls. When the enclosure slides up against a gasket around the back plane and the back plane is a grounded, a sixth, EMI shielding wall for the enclosure is formed. Air flow through the enclosure is provided by slots, or vents, in the front wall of the enclosure and holes in the back plane. Air flow can then be drawn in through the vents at the front of the enclosure and out through the back plane at the back of the enclosure.

Today, the oscillators and clocks in some electronic devices in these EMI shielding enclosures are operating at 500 megahertz or greater. The harmonics of the electromagnetic radiation from these devices may contain significant power and present a threat of high frequency electromagnetic interference with nearby electronic equipment. One design criteria accepted in the industry is that an enclosure with EMI shielding should shield the outside world from electromagnetic radiation originating at a source inside the enclosure up to frequencies including the $5^{th}$ harmonic of the fundamental frequency of the source. By this criteria, the enclosure must shield the outside world from electromagnetic radiation up to 2.5 gigahertz. Another standard in electromagnetic shielding is that the shield should provide for protection from frequencies equal to 5 divided by the rise time $T_r$ times $\pi$ ($5/T_r\pi$). By this criteria, a peripheral device having internal signals of 500 megahertz might have to be shielded with an enclosure capable of shielding for radiation up to frequencies of about nine gigahertz.

To provide for air flow through the enclosure, openings through the walls of the enclosure have been kept small. In the past, an opening less than ¼ inch in diameter through the enclosure wall was small enough to prevent any significant electromagnetic radiation from getting outside the enclosure. Such an opening is not effective at the high frequencies discussed above. One technique that can be used to provide air flow and, at the same time, provide electromagnetic shielding at high frequency are metal honeycomb screens having a predetermined fine mesh and predetermined thickness. These honeycomb metal screens make use of a tunnel attenuation effect to prevent electromagnetic radiation from escaping an EMI shielding enclosure.

Tunnel attenuation or waveguide attenuation provides very effective attenuation of electromagnetic radiation at very high frequencies. The cutoff frequency for such a waveguide attenuator is the frequency at which the wavelength of the emission is approximately equal to twice the diameter of the waveguide opening. For example, for a wavelength of five gigahertz, which is 2.4-inches, a 1.2-inch diameter hole would just begin to attenuate the five gigahertz signal. Below cutoff, the shielding effectiveness in attenuation is given by the expression:

Shielding Effectiveness=32T÷D, where T is the length of the waveguide and D is the diameter of opening of the waveguide.

With the above criteria in mind, a metal honeycomb mesh could be selected for the front wall of an enclosure by the diameter of the holes in the honeycomb mesh and the thickness of the honeycomb. The difficulty in solving the EMI shielding and air flow problem in this manner is that the honeycomb metal shield is extremely expensive and is also quite heavy for commercial applications. Therefore, what is needed is a lightweight, low cost electromagnetic shield with good airflow for application to an enclosures for electronic devices.

SUMMARY OF THE INVENTION

In accordance with this invention, the above problem has been solved by an EMI shield for an EMI shielding enclosure. The EMI shield is a non-conductive plate with a plurality of tunnel openings through the non-conductive plate. A conductive layer is coated on at least a surface of the non-conductive plate interior to the enclosure and on the walls of the tunnel openings. Each of tunnel openings acts as a waveguide attenuator and attenuates the high frequency electromagnetic radiation passing through the tunnel openings from the electronic device inside the enclosure. The non-conductive plate is an injection molded plastic plate with the tunnel openings molded into the plate. A copper layer is plated on at least a surface of the non-conductive plate interior to the enclosure and on the walls of the tunnel openings. A nickel layer is plated on the copper layer.

The EMI shielded enclosure, using the EMI shield plate, has a plurality of electrically conductive walls. The conductive walls are electrically connected so electromagnetic radiation from within the enclosure cannot radiate through the walls. The EMI shield plate then makes up at least one wall of the enclosure, and this wall is an electrically non-conductive, plastic wall with tunnel holes through the wall. The holes provide for air flow into and out of the enclosure. A conductive coating on the non conductive wall and the tunnel holes converts the non-conductive plastic wall into a conductive wall to prevent radiation through the wall. The tunnel holes, when coated with the conductive layer, become waveguide attenuating holes which attenuate electromagnetic radiation as it passes from inside the enclosure through said holes to outside the enclosure.

As a further feature of the invention the waveguide attenuating holes has a diameter D and the plastic wall has a thickness T whereby said waveguide attenuating holes provide attenuation proportional to 32 times T/D less 20 log square root of N. The number N is the largest number for the matrix in a matrix pattern of holes through the shield plate. The hole diameter D is in the range of 0.125 to 0.200 inches and the wall thickness T is in the range of 0.25 to 0.50 inches. The waveguide attenuating holes effectively attenuate electromagnetic radiation at frequencies up to 5 gigahertz.

The great advantage and utility of the EMI shield in the present invention is that a low cost EMI shield, that is easy to manufacture, is provided and the shield provides for a cooling air flow and electromagnetic radiation shielding at frequencies up to several gigahertz.

The foregoing and other features, utilities and advantages of the invention will be apparent from the following more particular description of a preferred embodiment of the invention as illustrated in the accompany drawings.

DETAILED DESCRIPTION OF THE PREFERRED EMBODIMENT

Figure 1:
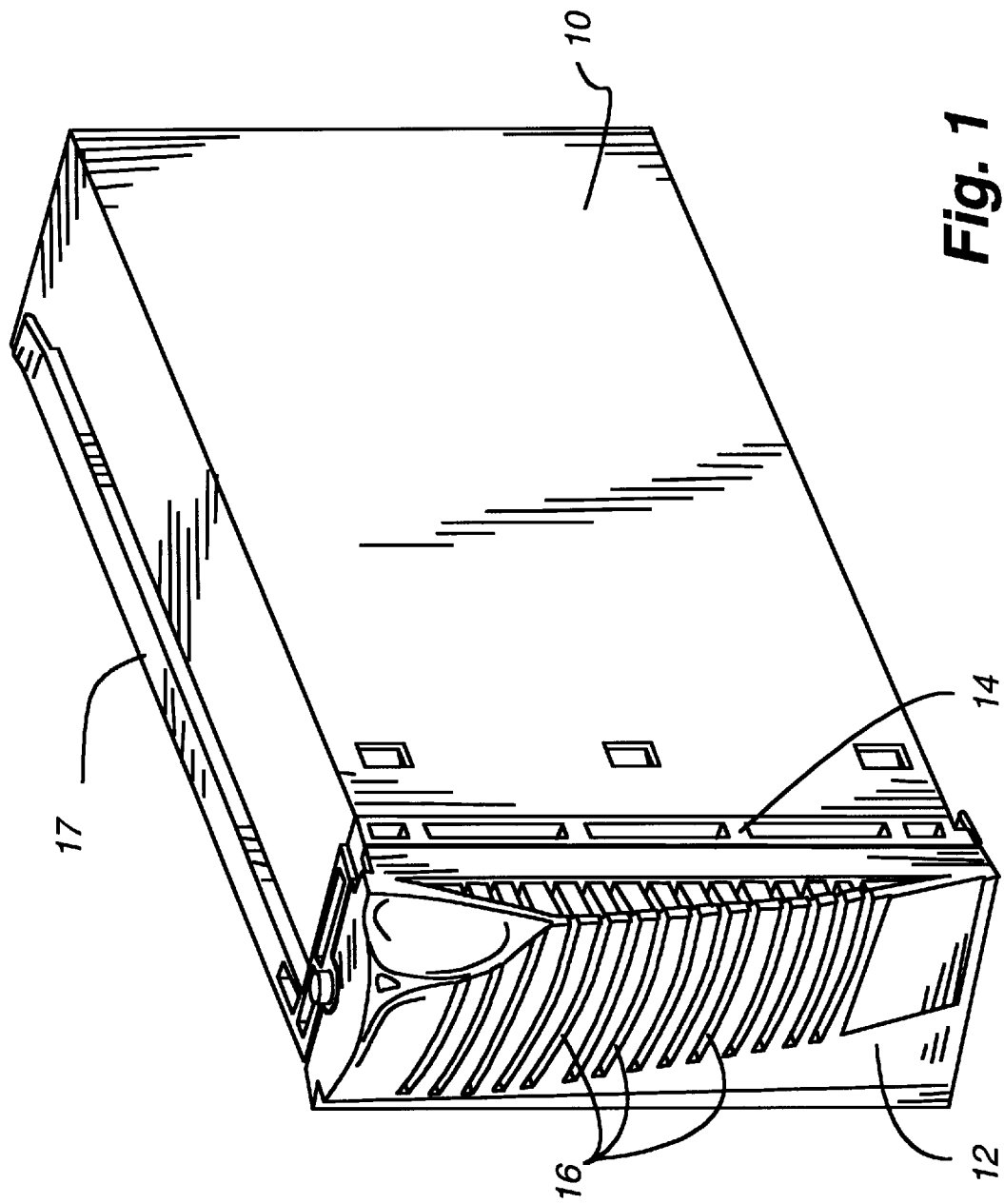
FIG. 1 shows a preferred embodiment an EMI shielding enclosure with a front cover.

FIG. 1 shows an enclosure for a peripheral device designed in accordance with the preferred embodiment of the invention to provide air flow while maintaining EMI shielding for high frequency electromagnetic radiation. The enclosure in FIG. 1 is made up of box 10 whose front end is covered by a front end decorative plate 12 and an EMI shield plate 14. Decorative plate 12 is a plastic molded piece containing slits 16 to provide air flow passages from the outside to the front surface of the EMI shield plate 14. Rails 17 are attached to the EMI shield plate 14 and are used to guide the enclosure as the enclosure slides into a shelf frame on tracks in the frame.

Figure 2:
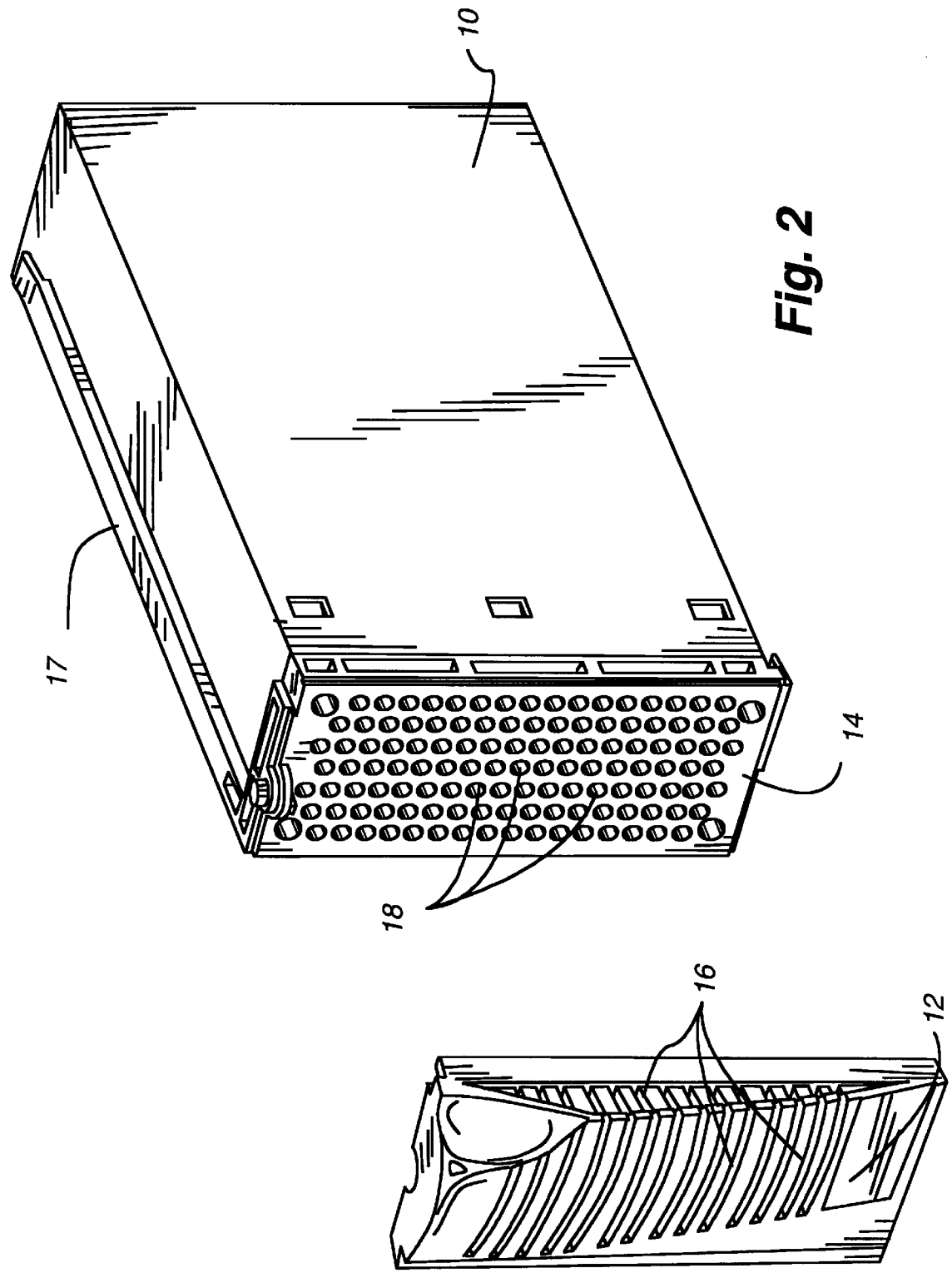
FIG. 2 shows the EMI shielding enclosure of FIG. 1 with the front cover exploded away from a air flow, EMI shield plate at the front of the enclosure.

In FIG. 2, the decorative plate 12 has been exploded away from the EMI shield plate 14. EMI shield 14 has a plurality of holes 18 to allow air to flow into the interior of the enclosure. Decorative plate 12 has a cavity (not shown) on its back surface whereby air flowing through slots 16 may flow into any of the holes 18 in the EMI shield 14.

Figure 3:
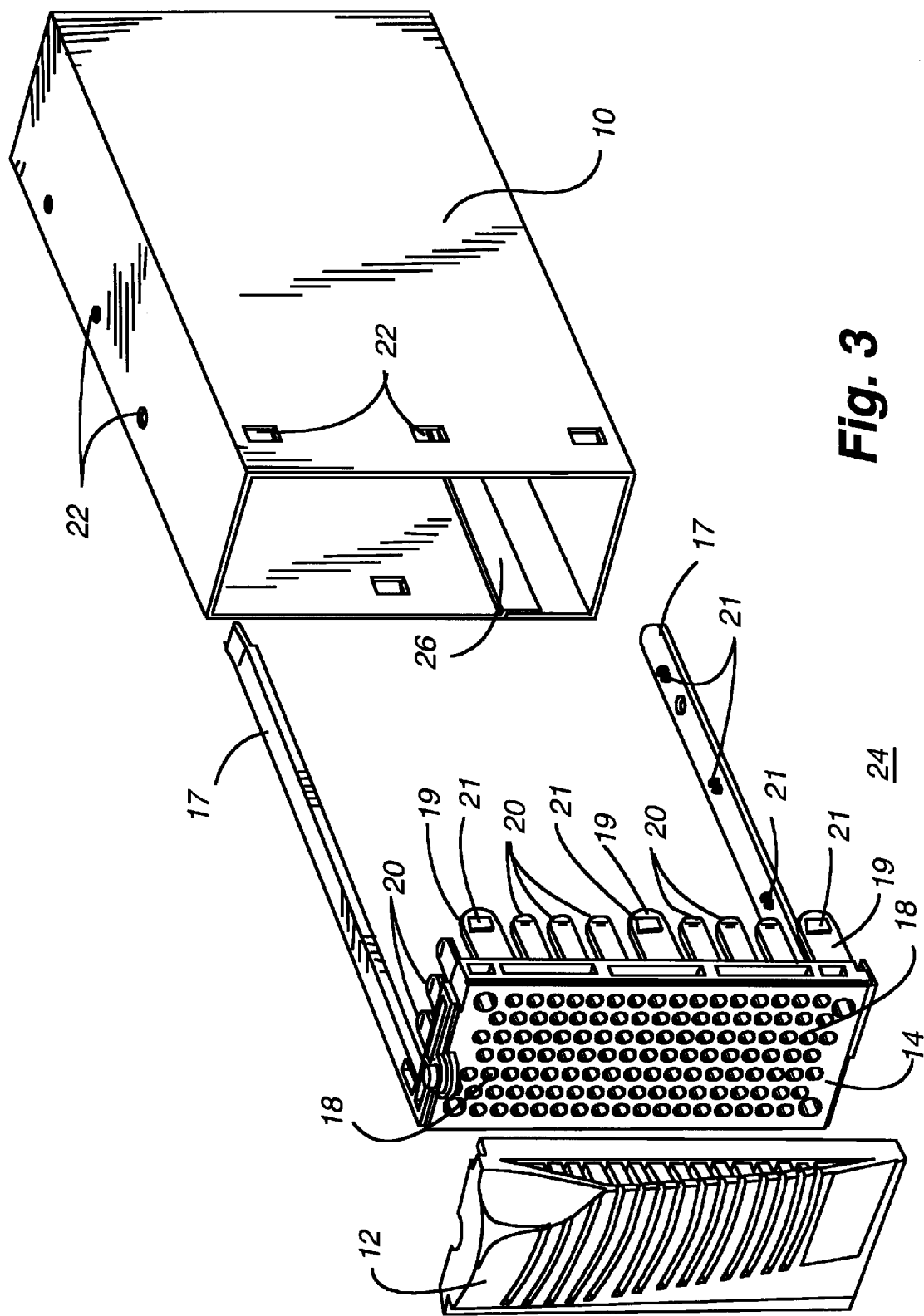
FIG. 3 shows the air flow, EMI shield plate exploded away from the front of the enclosure.

In FIG. 3, the EMI shield plate has been exploded away from the four sided electrically conductive enclosure 10. As shown in FIG. 3, the guide rails 17 are attached to the shield 14. Also attached to the shield plate 14 are fingers 20 which make contact with the interior walls of enclosure 10. Rails 17 and fingers 19 contain protuberances 21 for engaging holes 22 in enclosure 10. In this way, shield 14 snaps into place and is held attached to enclosure 10.

Shield plate 14, rails 17, finger 19 and 20 are preferably a molded plastic, single piece. The entire molded piece 24 is plated with a conductive material. Preferably, piece 24 is plated with copper and then a layer of nickel over the copper. The entirety of piece 24, including the shield, the interior of the holes, the rails 17, the fingers 19 and 20, the protuberances 21 are all plated with nickel over copper.

Open end enclosure 10 is a conductive metal box with an open front end and back end. The metal box 10 is made from a single piece of metal folded into a open end box with a single seam 26. The entire length of seam 26 is seam welded, spot welded, soldered or otherwise electrically bonded to seal the seam against electromagnetic radiation through the seam.

After the open end enclosure, or box 10, is formed, then the shield piece 24 is snapped onto the box. Rails 17 slip over the exterior side walls of the enclosure and protuberances 21 on rails 17 snap into and fill the holes 22 on the side of the box 10. Fingers 19 and 20 are inside the box with protuberances 21 on fingers 19 snapping in and filling the holes 22 in the top and bottom of the box. Since the entire piece 24 is coated with nickel/copper, the resulting enclosure is sealed, except for the holes 18 in the shield plane 14 and the open back of the enclosure. The back of the enclosure is, of course, sealed when the enclosure is inserted into the shelf frame and engages the back plane. Air flow through the back plane can be provided as described in U.S. Pat. No. 5,483,423 discussed above. Alternatively, the back plane may be structured in the same manner as the shield plate 14.

The holes 18 in shield plate 14 are designed to be a waveguide attenuators. Thus, the diameter of the holes and the thickness of the shield plate are designed to attenuate electromagnetic radiation at very high frequencies. For the highest frequency to be attenuated, the thickness, T, of plate 14 and the diameter, D, of holes 18 is chosen to satisfy the tunnel attenuation shielding effectiveness which is 32×T÷D minus 20 log square root of N. The number N is the number of holes 18 in the longest dimension of the matrix of holes in the shield plate. For example if there is a matrix of 15 holes by 12 holes, N=15. Since the shield plate is a molded plastic part, the holes will not be of uniform diameter from front to back. Therefore, the diameter, D, used in calculating attenuation is based on the largest diameter that the hole could be.

Besides the tunnel attenuation factor and the frequency to which the shield is designed, there are other criteria for the shield. These other criteria include the air flow required which determines in part the equivalent surface area opening through shield 14 provided by all holes 18. A second constraint is the separation between holes 18 in the shield plate to provide for good molding of the plastic shield plate. Another criteria can be thickness of the plate to provide good fire shielding in the event that the peripheral device inside the enclosure catches on fire.

With all of these constraints in mind, and principally the EMI shielding of high frequencies in mind, it has been found that for electromagnetic radiation at frequencies up to five gigahertz, the diameter of holes 18 should be in the range 0.125–0.200 inches, and the thickness of the plate 14 should be in the range 0.25–0.50 inches for approximately 40 db shielding.

While in the preferred embodiment the shield plate 14 is placed at the front of the enclosure, the air-flow, EMI shield could be placed on a side wall of the enclosure. Placement will be dictated by the air flow pattern required for the enclosure and the cabinet holding the enclosure. Further in another embodiment of the invention, the enclosure 10, EMI shield plate 14 and rails 17 could all be molded as separate plastic pieces or a single piece and then covered with a conductive coating such as nickel over copper.

While the invention has been particularly shown and described with reference to a preferred embodiments thereof, it will be understood by those skilled in the art that various other changes in the form and details may be made therein without departing from the spirit and scope of the invention.

What is claimed is:

1. An EMI shielded enclosure for shielding electrical equipment outside the enclosure from electromagnetic radiation originating from a source within the enclosure, said enclosure comprising:

a plurality of electrically conductive walls, said walls being electrically connected so electromagnetic radiation from within the enclosure cannot radiate through the walls;

at least one of the walls of the enclosure being electrically non-conductive plastic and having a thickness T;

waveguide attenuating holes molded to extend through said non-conductive wall of the enclosure providing for air flow into and out of the enclosure, the waveguide attenuating holes; and said waveguide attenuating holes attenuating electromagnetic radiation passing from inside the enclosure through said holes to outside the enclosure, attenuation provided by the waveguide attenuating holes proportional to 32 times T/D.

2. The EMI shielded enclosure of claim 1 where D is in the range of 0.125 to 0.200 inches and T is in the range of 0.25 to 0.50 inches whereby said waveguide attenuating holes effectively attenuate electromagnetic radiation at frequencies up to 5 gigahertz.

3. The EMI shield of claim 1 wherein said conductive coating comprises:

a copper layer plated on at least a surface of the non-conductive wall interior to the enclosure; and a nickel layer plated on the copper layer.

4. The EMI shield of claim 1 further comprising a decorative plate at least partially covering the non-conductive wall.

* * * * *

UNITED STATES PATENT AND TRADEMARK OFFICE
CERTIFICATE OF CORRECTION

PATENT NO.   : 6,018,125
DATED        : January 25, 2000
INVENTOR(S)  : Collins et al.

It is certified that error appears in the above-identified patent and that said Letters Patent is hereby corrected as shown below:

Column 6,
Line 6, after "attenuating holes" delete ";and" insert -- each having a diameter D; --
Line 7, insert -- a conductive coating of electroconductive metal deposited on all surfaces of said non-conductive wall and said waveguide attenuating holes; and --

Signed and Sealed this

Twenty-ninth Day of October, 2002

Attest:

Attesting Officer

JAMES E. ROGAN
Director of the United States Patent and Trademark Office